United States Patent
Wada

(10) Patent No.: US 8,675,893 B2
(45) Date of Patent: Mar. 18, 2014

(54) ELECTRONIC APPARATUS

(75) Inventor: Naoyuki Wada, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 387 days.

(21) Appl. No.: 12/971,974

(22) Filed: Dec. 17, 2010

(65) Prior Publication Data

US 2011/0158431 A1 Jun. 30, 2011

(30) Foreign Application Priority Data

Dec. 25, 2009 (JP) ................................. 2009-295624

(51) Int. Cl.
*H03G 3/00* (2006.01)

(52) U.S. Cl.
USPC ........................................................ 381/104

(58) Field of Classification Search
USPC ........... 700/94; 381/306, 94.5, 104, 120, 123, 381/107
See application file for complete search history.

(56) References Cited

U.S. PATENT DOCUMENTS

| | | | | |
|---|---|---|---|---|
| 5,220,613 A | * | 6/1993 | Nishioka et al. | 381/104 |
| 5,740,453 A | * | 4/1998 | Lada, Jr. | 713/330 |
| 6,006,337 A | * | 12/1999 | Koo | 713/324 |
| 6,128,263 A | | 10/2000 | Fujii et al. | |
| 6,279,056 B1 | * | 8/2001 | Jacobs et al. | 710/48 |
| 6,573,787 B2 | * | 6/2003 | Ikin | 330/51 |
| 6,678,014 B1 | * | 1/2004 | Jin et al. | 348/738 |
| 6,711,631 B1 | * | 3/2004 | Chan et al. | 710/14 |
| 7,076,646 B2 | * | 7/2006 | Chang | 713/1 |
| 7,673,156 B1 | * | 3/2010 | Nojima | 713/300 |
| 2001/0022842 A1 | | 9/2001 | Fujii | |
| 2003/0086683 A1 | | 5/2003 | Morisawa | |
| 2005/0050239 A1 | | 3/2005 | Kimura | |
| 2006/0023897 A1 | * | 2/2006 | Ginsberg et al. | 381/94.8 |
| 2006/0028362 A1 | | 2/2006 | Fujiwara | |
| 2006/0080475 A1 | * | 4/2006 | Lam et al. | 710/14 |
| 2007/0064955 A1 | * | 3/2007 | Saito | 381/58 |
| 2008/0282099 A1 | * | 11/2008 | Yamaguchi | 713/320 |
| 2009/0003619 A1 | * | 1/2009 | Solow | 381/77 |

(Continued)

FOREIGN PATENT DOCUMENTS

| | | | | |
|---|---|---|---|---|
| JP | 02-260900 | | 10/1990 | |
| JP | 04183120 A | * | 6/1992 | H04B 1/10 |

(Continued)

OTHER PUBLICATIONS

Machine Translation of Nojima (JP 2000305672 A).*

(Continued)

*Primary Examiner* — Vivian Chin
*Assistant Examiner* — Leonard M Giannone
(74) *Attorney, Agent, or Firm* — Blakely, Sokoloff, Taylor & Zafman LLP

(57) ABSTRACT

According to one embodiment, an electronic apparatus includes a speaker, a terminal, an amplifier, a power supply circuit, and a first controller. The terminal is configured to input an audio signal from an external apparatus. The amplifier is configured to amplify the audio signal which is input from the terminal, and to output sound from the speaker. The power supply circuit is configured to supply power to the amplifier. The first controller is configured to control the power supply circuit in order to continue the supply of power to the amplifier, if the external apparatus is connected to the terminal when the electronic apparatus transitions from a operative state to a non-operative state.

9 Claims, 8 Drawing Sheets

(56) References Cited

U.S. PATENT DOCUMENTS

| | | | |
|---|---|---|---|
| 2009/0060226 A1* | 3/2009 | Chen et al. | 381/107 |
| 2011/0129103 A1* | 6/2011 | Hara et al. | 381/120 |
| 2011/0129104 A1* | 6/2011 | Saito | 381/120 |
| 2011/0158436 A1* | 6/2011 | Imamura | 381/120 |
| 2011/0188675 A1* | 8/2011 | Shimoharada | 381/120 |
| 2011/0261978 A1* | 10/2011 | Yamaguchi | 381/120 |
| 2012/0237059 A1* | 9/2012 | Saito | 381/120 |

FOREIGN PATENT DOCUMENTS

| | | | | |
|---|---|---|---|---|
| JP | 07-239737 | | 9/1995 | |
| JP | 11-086433 | | 3/1999 | |
| JP | 2000-305672 | | 2/2000 | |
| JP | 2000-039935 | | 8/2000 | |
| JP | 2000305672 A | * | 11/2000 | G06F 1/32 |
| JP | 2001-197599 | | 7/2001 | |
| JP | 2001-216132 | | 8/2001 | |
| JP | 2001-359184 | | 12/2001 | |
| JP | 2002-142161 | | 5/2002 | |
| JP | 2003-015801 | | 1/2003 | |
| JP | 2003-134419 | | 5/2003 | |
| JP | 2003-140879 | | 5/2003 | |
| JP | 2003-243952 | | 8/2003 | |
| JP | 2003-309892 | | 10/2003 | |
| JP | 2005-078496 | | 3/2005 | |
| JP | 2005-203040 | | 7/2005 | |
| JP | 2006-050170 | | 2/2006 | |
| JP | 2006-166187 | | 6/2006 | |
| JP | 2006-525598 | | 11/2006 | |
| JP | 2007-166557 | | 6/2007 | |
| JP | 2007166557 A | * | 6/2007 | |

OTHER PUBLICATIONS

Machine Translation of Yamamoto (JP 2007166557 A).*
Japanese Patent Application No. 2009-295624; Notice of Reasons for Rejection; Mailed Aug. 9, 2011 (English translation).
Japanese Patent Application No. 2009-295624; Notice of Reasons for Rejection; Mailed Apr. 26, 2011 (English translation).

* cited by examiner

| State of PC | Presence/absence of plug | P-power | A-power | B-power | S-power |
|---|---|---|---|---|---|
| PC power-on | — | ON | ON | ON | ON |
| PC standby | Without plug insertion | OFF | OFF | ON | ON |
| | With plug insertion | OFF | ON | ON | ON |
| PC hibernation | Without plug insertion | OFF | OFF | OFF | ON |
| | With plug insertion | OFF | ON | OFF | ON |
| PC power-off | Without plug insertion | OFF | OFF | OFF | ON |
| | With plug insertion | OFF | ON | OFF | ON |

FIG. 3

At time of PC standby (without plug insertion)

| | P-power | A-power | B-power | S-power |
|---|---|---|---|---|
| CPU | × | | | |
| MCH | × | | ○ | |
| Main memory | | | ○ | |
| HDD | × | | | |
| ICH | × | | | |
| EC | | | | ○ |
| Sound controller | × | | | |
| Analog switch | | × | | |
| Speaker amplifier | | × | | |
| Display | × | | | |

FIG. 4

At time of PC standby (with plug insertion)

|  | P-power | A-power | B-power | S-power |
|---|---|---|---|---|
| CPU | × |  |  |  |
| MCH | × |  | ○ |  |
| Main memory |  |  | ○ |  |
| HDD | × |  |  |  |
| ICH | × |  |  |  |
| EC |  |  |  | ○ |
| Sound controller | × |  |  |  |
| Analog switch |  | ○ |  |  |
| Speaker amplifier |  | ○ |  |  |
| Display | × |  |  |  |

F I G. 5

| Output level setting of sound controller | Output level setting of speaker amplifier |
|---|---|
| CL1 | AL1 |
| CL2 | AL2 |
| ⋮ | ⋮ |
F I G. 7
F I G. 8A
Line-in analog
Audio input set level
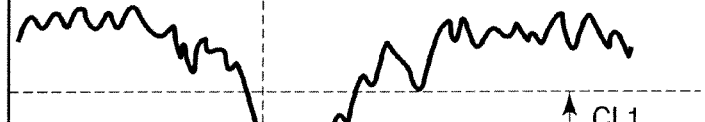
F I G. 8B
Sound controller output
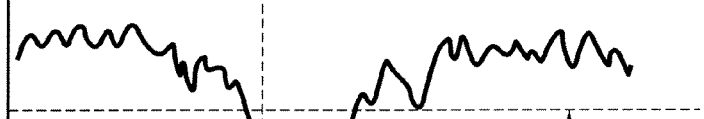
F I G. 8C
Speaker amplifier output
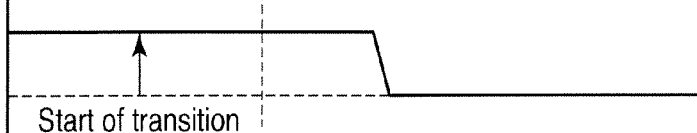
F I G. 8D
PC operation state
Power-on
Standby
Start of transition to standby state

ELECTRONIC APPARATUS

CROSS-REFERENCE TO RELATED APPLICATIONS

This application is based upon and claims the benefit of priority from Japanese Patent Application No. 2009-295624, filed Dec. 25, 2009; the entire contents of which are incorporated herein by reference.

FIELD

Embodiments described herein relate generally to an electronic apparatus having a speaker.

BACKGROUND

Conventionally, there is known a digital audio system which takes in a plurality of audio data and plays back and outputs the audio data.

In an audio system disclosed in Jpn. Pat. Appln. KOKAI Publication No. 2003-243952, the volume (recording level) of audio data is detected and an automatic volume adjustment element is generated. When the audio data is played back, the playback volume is adjusted, based on the automatic volume adjustment element. Thereby, even when a plurality of audio data are taken in, the audio data can be output by eliminating a variance in volume between the audio data.

In the prior art, as described above, even if there is a variance in volume (recording level) between a plurality of audio data, the playback volume is automatically adjusted and the audio data can be output with a fixed volume.

However, in the prior art, although the variance in volume between the audio data can be eliminated, it is not possible to adjust the variation in playback volume, which occurs due to the difference between operation states of the system.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 3 is an exemplary view showing powers which are supplied in the respective states of the personal computer according to the embodiment;

FIG. 4 is an exemplary view showing modules which are supplied with power at a time of a standby state without insertion of a plug in a line-in terminal in the embodiment;

FIG. 5 is an exemplary view showing modules which are supplied with power at a time of the standby state with the plug being inserted in the line-in terminal in the embodiment;

FIG. 7 shows an example of data indicative of the relationship in correspondence between the output level set value of a sound controller and the output level set value of a speaker amplifier in the embodiment;

FIG. 8A, FIG. 8B, FIG. 8C and FIG. 8D are views for explaining a process on an audio signal in the embodiment;

DETAILED DESCRIPTION

Various embodiments will be described hereinafter with reference to the accompanying drawings.

In general, according to one embodiment, an electronic apparatus comprises a speaker, a terminal, an amplifier, a power supply circuit, and a first controller. The terminal is configured to input an audio signal from an external apparatus. The amplifier is configured to amplify the audio signal which is input from the terminal, and to output sound from the speaker. The power supply circuit is configured to supply power to the amplifier. The first controller is configured to control the power supply circuit in order to continue the supply of power to the amplifier, if the external apparatus is connected to the terminal when the electronic apparatus transitions from a operative state to a non-operative state.

An embodiment will now be described with reference to the accompanying drawings.

Figure 1:
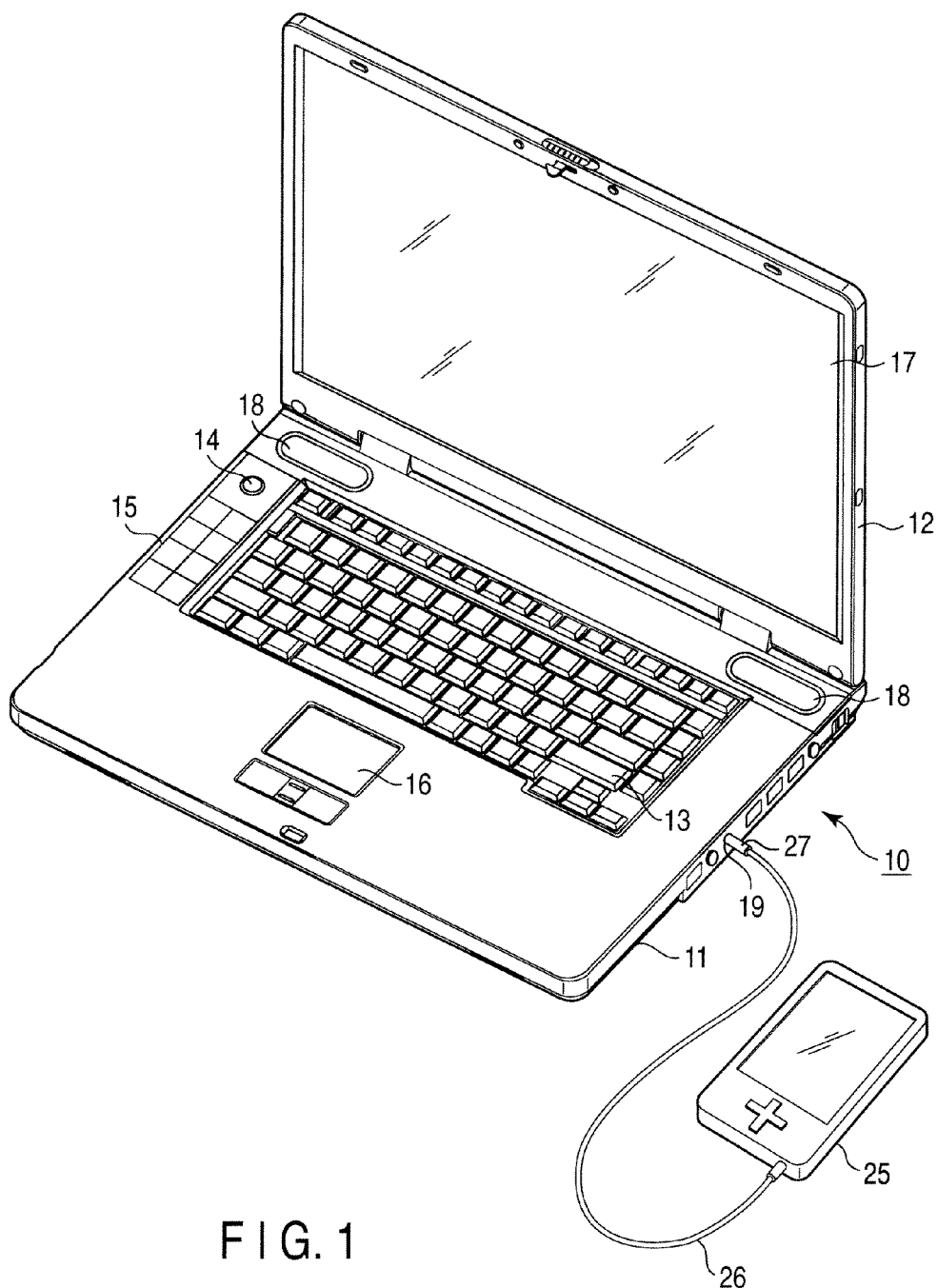
FIG. 1 is an exemplary external appearance view showing the structure of an electric apparatus according to an embodiment.

FIG. 1 shows the external appearance of an electronic apparatus according to the embodiment. The electronic apparatus is realized, for example, as a notebook-type portable personal computer 10. The personal computer 10 of this embodiment has an audio output function (sleep & music function) for receiving, at a time of a non-operative state, an analog audio signal which is output from a line-out-equipped external device (e.g. a portable audio player 25), and outputting the audio signal from speakers 18 which are mounted on the housing of the computer 10.

When the output from the audio player 25 is directly connected to the speakers, since the output of the audio player 25 is small, compared to the capability of the speakers, the speakers are unable to output sound of a sufficient volume. According to the audio output function that is provided in the personal computer 10 in this embodiment, even in the case where the personal computer 10 is in the non-operative state, power is supplied to a built-in amplifier for audio signal amplification, thus being able to amplify the audio signal from the audio player 25 and output the amplified audio signal from the speakers.

It is assumed that the "non-operative state" of the personal computer 10 includes states called "standby/sleep/suspend" and "hibernation" (hibernate state), as well as a power-off state. In short, the non-operative state is a state in which the processor (CPU 30) does not operate.

If the audio player 25 is connected to the personal computer 10 in the embodiment when the operation state transitions from an operative state, in which power is turned on, to a non-operative state, or from the non-operative state to the operative state, the personal computer 10 operates in a manner to continuously output sound, which corresponds to an analog audio signal that is output from the audio player 25, from the speakers at a fixed volume.

FIG. 1 is a perspective view showing the state in which a display unit of the personal computer 10 is opened. The personal computer 10 comprises a computer main body 11 and a display unit 12. A display device, which is composed of an LCD (Liquid Crystal Display) 17, is built in the display unit 12. The display screen of the LCD 17 is disposed at a substantially central part of the display unit 12.

The display unit 12 is attached to the computer main body 11 such that the display unit 12 is rotatable between an open position and a closed position, relative to the computer main body 11. The computer main body 11 has a thin box-shaped housing, to which a battery is detachably attached.

A keyboard 13, a power button switch 14 for power-on/off, general-purpose hardware buttons 15, a touch pad 16, and speakers 18 are disposed on the top surface of the computer main body 11.

A side surface of the computer main body 11 is provided with a line-in terminal 19 (jack) for receiving an analog audio signal which is output from the audio player 25. A cable 26, which is connected to a line-out terminal of the audio player 25, can be connected to the line-in terminal 19 by a plug 27.

Figure 2:
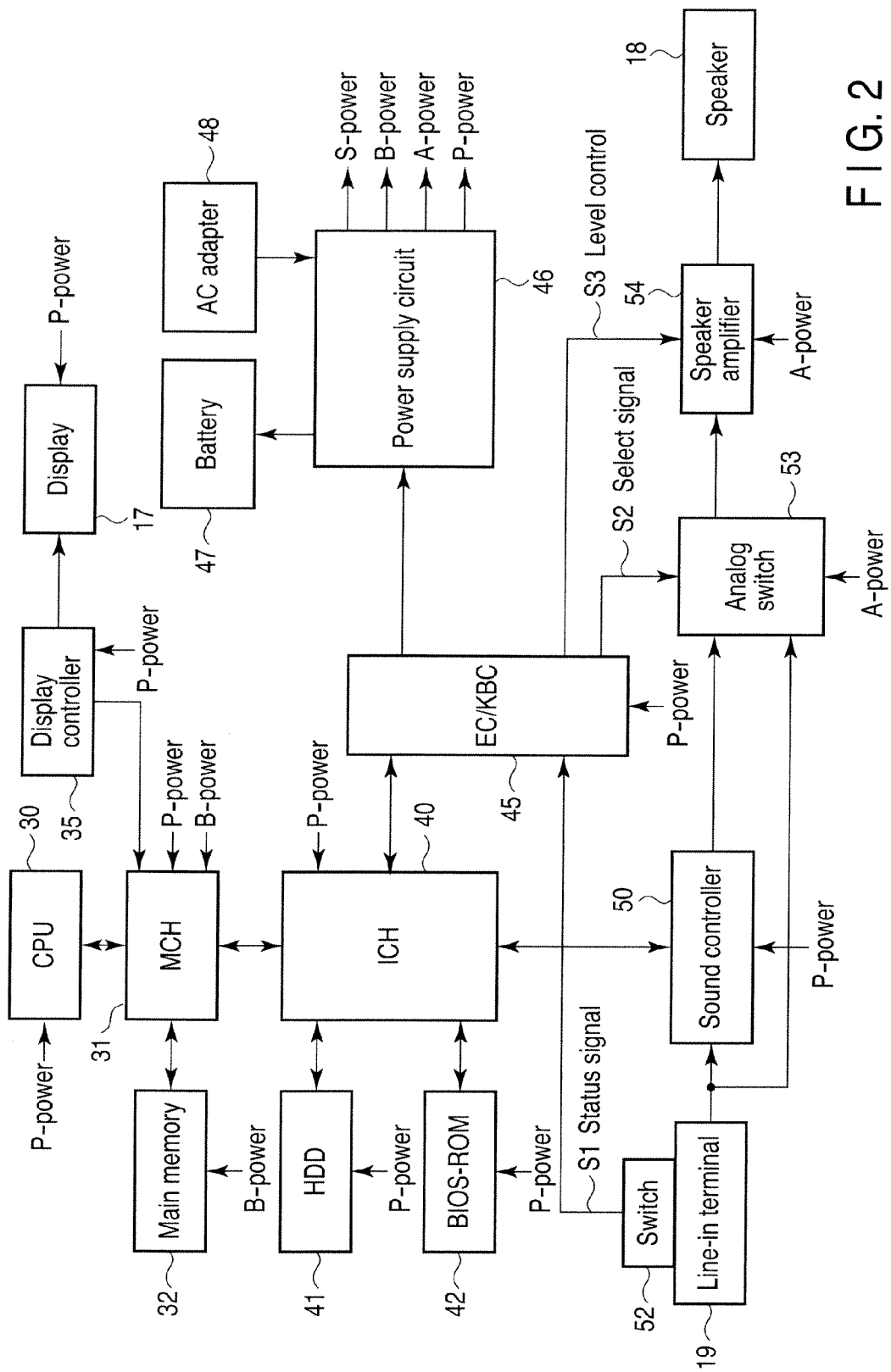
FIG. 2 is an exemplary block diagram showing the system configuration of a personal computer according to the embodiment.

Next, referring to FIG. 2, a description is given of the system configuration of the personal computer 10 according to the embodiment.

The personal computer 10, as shown in FIG. 2, includes a CPU 30, an MCH 31 (north bridge), a main memory 32, a display controller 35, an ICH 40 (south bridge), a hard disk drive (HDD) 41, a BIOS-ROM 42, an embedded controller/keyboard controller IC (EC/KBC) 45, and a power supply circuit 46.

The CPU 30 is a processor which is provided in order to control the operation of the personal computer 10, and executes an operating system (OS), drivers for controlling various hardware, and various application/utility programs, which are loaded from the HDD 41 into the main memory 32. The CPU 30 also executes a system BIOS (Basic Input/Output System) which is stored in the BIOS-ROM 42. The system BIOS is a program for hardware control.

The MCH 31 is a bridge device which connects a local bus of the CPU 30 and the ICH 40. The MCH 31 incorporates a memory controller for access-controlling the main memory 32.

The display controller 35 controls the LCD 17 which is used as a display monitor of the personal computer 10. Based on an image-rendering request which is sent from the CPU 30 via the MCH 31, the display controller 35 executes a display process (graphics arithmetic process) for rendering frames in a video memory (VRAM).

The ICH 40 incorporates an IDE (Integrated Drive Electronics) controller and a Serial ATA controller for controlling the HDD 41 and an optical disc drive (not shown).

The embedded controller/keyboard controller IC (EC/KBC) 45 is a one-chip microcomputer in which an embedded controller for power management and a keyboard controller for controlling the keyboard (KB) 13, touch pad 15 and general-purpose hardware buttons 18 are integrated. The EC/KBC 45 is a controller which operates even when the personal computer 10 is in a power-off state (non-operative state).

The EC/KBC 45 has a function of controlling the power supply circuit 46 in accordance with an operation of the power button switch 14 by a user, and powering on/off the personal computer 10. The power-on/off control of the personal computer 10 is executed by the cooperation between the EC/KBC 45 and power supply circuit 46. In addition, the EC/KBC 45 controls the audio output function which is used when the personal computer 10 is in the non-operative state.

The power supply circuit 46 receives power from a battery 47 which is attached to the computer main body 11 or from an external power supply which is connected via an AC adapter 48, and generates and supplies operation power to the respective components. The power supply circuit 46 is provided with a power supply microcomputer. The power supply microcomputer monitors the power supply (charge/discharge) relating to the respective components and the battery, and the charging state of the battery.

The power supply circuit 46 switches the power supply to the respective modules by the control of the EC/KBC 45, in accordance with the system state of the personal computer 10. By the control of the EC/KBC 45 according to the system state of the personal computer 10, the power supply circuit 46 can turn on/off the power supply of power supply systems of an S-power, a B-power, an A-power and a P-power.

The S-power is a power which is always supplied even in the state in which the system is powered off, and is supplied to the EC/KBC 45.

The B-power is a power which is supplied in a standby state in order to back up data which is recorded in the main memory 32.

The A-power is a power for enabling the audio output function when the personal computer 10 is in the non-operative state, and is supplied to an analog switch 53 and a speaker amplifier 54, which process an analog audio signal.

The P-power is a power which is supplied when the personal computer 10 is in the power-on state.

FIG. 3 shows powers which are supplied in the respective states (system states) of the personal computer 10.

As shown in FIG. 3, when the personal computer 10 is in the power-on state (operative state), the power supply circuit 46 turns on power supply of all of the S-power, B-power, P-power and A-power.

When the personal computer 10 is in the standby state (or in the sleep/suspend state), the power supply of the S-power and B-power is turned on. However, in the personal computer 10 of the present embodiment, in order to use the audio output function in the standby state, the supply of the A-power is further turned on when the plug 27 for connection of the cable 26 (portable audio player 25) is inserted in the line-in terminal 19, thereby to supply power to the analog switch 53 and speaker amplifier 54 which are operated in the audio output function.

When the personal computer 10 is in the power-off state or in the hibernation (hibernate state) in which backup for the main memory 32 is unnecessary, only the supply of the S-power is turned on. However, in the personal computer 10 of the present embodiment, in order to use the audio output function in the power-off state, the supply of the A-power is further turned on when the plug 27 for connection of the cable 26 (portable audio player 25) is inserted in the line-in terminal 19, thereby to supply power to the analog switch 53 and speaker amplifier 54 which are operated in the audio output function.

Since the S-power is supplied to the EC/KBC 45, the power supply is turned on in any one of the system states and the control of the audio output function at the non-operation time is enabled.

The sound controller 50 (audio codec) converts digital audio data, which is input via the ICH 40, to an analog audio signal, and outputs the analog audio signal to the analog switch 53 by adjusting a volume or a sound quality (sound effect) by the control of the OS, device driver, audio playback program, etc. Similarly, when the personal computer 10 is in the operative state, the sound controller 50 executes volume control of an analog audio signal from the audio player 25, which is input via the line-in terminal 19, and outputs the resultant analog audio signal to the analog switch 53.

The analog switch 53 switches the path between the sound controller 50 side and the line-in terminal 19 side, in accordance with a select signal S2 from the EC/KBC 45. Under the control of the EC/KBC 45, the analog switch 53 is changed over to the sound controller 50 side when the personal computer 10 is in the operative state. When the audio output function is enabled at the non-operation time, the analog switch 53 is changed over to the line-in terminal 19 side, with the sound controller 50 being bypassed.

The speaker amplifier 54 amplifies the analog audio signal which is input via the analog switch 53, and outputs sound corresponding to the audio signal from the speakers 18. In addition, in accordance with a level control signal S3 from the EC/KBC 45, the speaker amplifier 54 can switch an output level set value (the amplification factor of the input analog audio signal).

A switch (or sensor) 52 is incorporated in the line-in terminal 19. The ON/OFF of the switch 52 is changed by the insertion of the plug 27 for connection of the cable 26 in the line-in terminal 19, and the switch 52 outputs a status signal S1 corresponding to the ON/OFF state to the EC/KBC 45.

FIG. 4 and FIG. 5 show modules to which power is supplied at the time of the standby (sleep) state of the personal computer 10 in the embodiment. FIG. 4 shows the case in which the plug 27 is not inserted in the line-in terminal 19, and FIG. 5 shows the case in which the plug 27 is inserted in the line-in terminal 19.

At the time of power-on, power is supplied to the respective components of the CPU 30, MCH 31, ICH 40, main memory 32, HDD 41, sound controller 50, analog switch 53 and speaker amplifier 54. However, in the standby state (without insertion of plug 27), the S-power is supplied and, in addition, the B-power is supplied in order to back up the data which is recorded in the main memory 32. In the standby state, the power supply to many modules including the CPU 30 is turned off in the standby mode (non-operative state) with reduced power consumption. In the standby state, since the CPU 30 does not operate, no program can be executed.

As shown in FIG. 5, when the plug 27 is inserted in the standby state, while the power supply to many modules including the CPU 30 is turned off in the standby mode with reduced power consumption, the A-power is supplied to only the speaker amplifier 54 and analog switch 53 which are associated with the audio output function. Thereby, with the personal computer 10 being kept in the non-operative state, the analog audio signal which is output from the audio player 25 can be amplified and output from the speakers 18.

Although not shown, when the personal computer 10 is in the power-off state or in the hibernation state, the supply of the B-power in the standby state shown in FIG. 4 or FIG. 5 is turned off. When the plug 27 is inserted, the supply of the A-power is turned on, as in the case of the standby state.

Next, the operation of the personal computer 10 in the embodiment is described.

In the personal computer 10 in the embodiment, when a transition occurs from the operative state (power-on) to the non-operative state such as a power-off state or standby state, or when a transition occurs from the non-operative state to the operative state, if the plug 27 for connection of the cable 26 is inserted in the line-in terminal 19 and the sound corresponding to the analog audio signal from the audio player 25 is being output from the speakers 18, such a switching control is executed as to keep constant the output level (volume) of the sound before and after the switching of the operation state and to make an interruption of sound less recognizable by the user.

Figure 6:
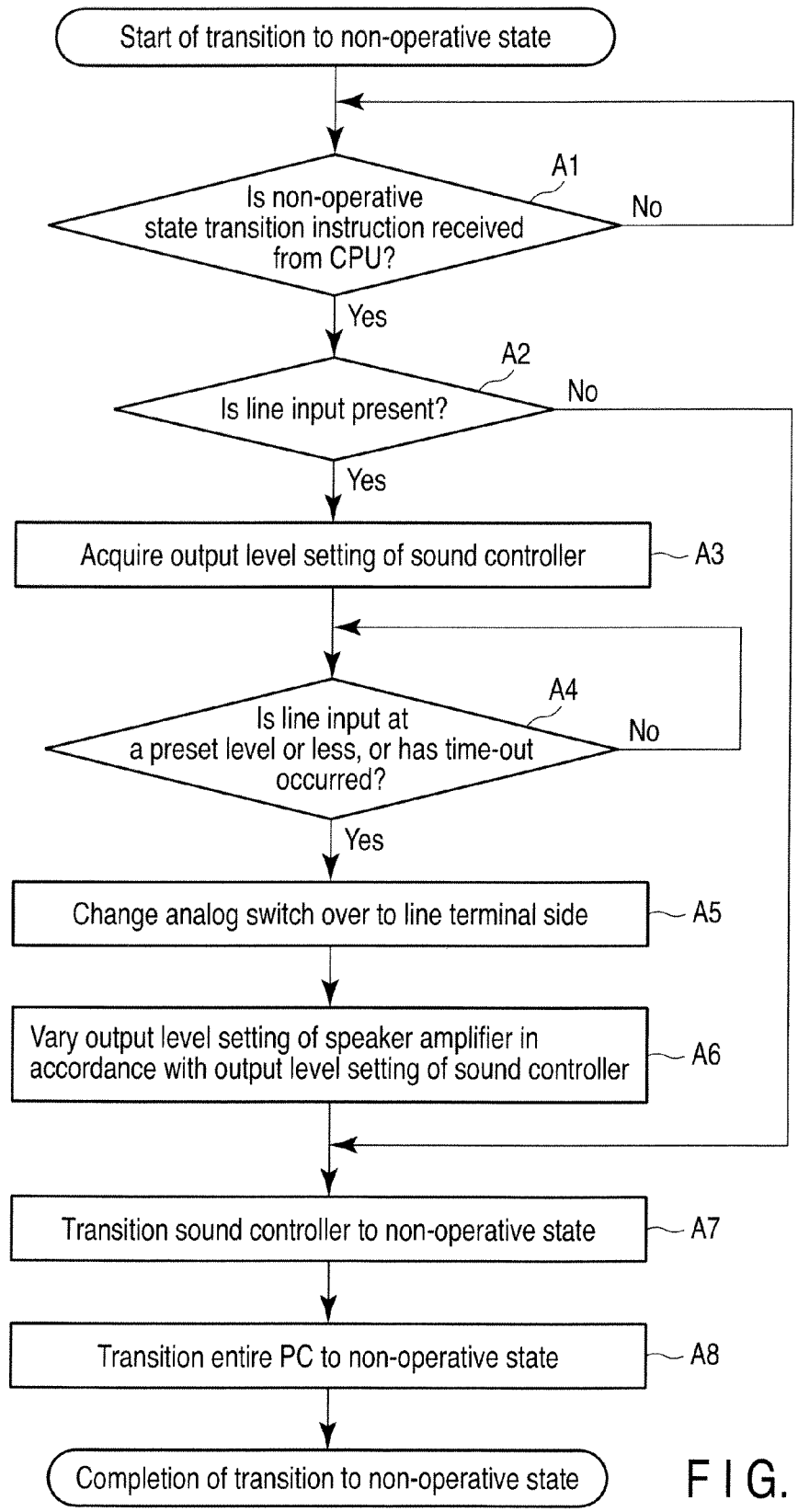
FIG. 6 is an exemplary flow chart illustrating an operation at a time when the personal computer in the embodiment transitions from an operative state to a non-operative state.

FIG. 6 is a flow chart illustrating an operation at a time when the personal computer 10 transitions from the operative state (power-on state) to the non-operative state.

When the personal computer 10 is in the power-on state (operative state), the EC/KBC 45 changes the analog switch 53 over to the sound controller 50 side by a select signal S2.

In the audio process, the OS, device driver, software program, etc. operate to control the respective modules. Under the control of the program, the sound controller 50 converts digital audio data to an analog audio signal, and outputs the analog audio signal to the analog switch 53. The speaker amplifiers 54 amplifies the analog audio signal, which is input via the analog switch 53, and causes the speakers 18 to output sound.

In addition, the sound controller 50 executes volume control on an analog audio signal which is input from the line-in terminal 19, and outputs the resultant signal to the analog switch 53. Similarly, the speaker amplifiers 54 amplifies the analog audio signal, which is input via the analog switch 53, and causes the speakers 18 to output sound.

In the power-on state, the output audio from the audio player 25 is produced from the speakers 18 via the sound controller 50. Thereby, using the function provided in the sound controller 50 or the function of an audio control program for controlling the sound controller 50, the volume or sound quality (e.g. sound effect) can be adjusted and sound can be output from the speakers 18.

The analog switch 53 effects switching as to whether the sound corresponding to the analog audio signal that is input from the line-in terminal 19 is directly output from the speakers 18 not through the sound controller 50 (first path), or the sound corresponding to the analog audio signal that is input from the line-in terminal 19 is output from the speakers 18 via the sound controller 50 after the personal computer 10 is activated (second path). The analog switch 53 is changed over by the control of the CPU 30 via the EC/KBC 45, or by the control of the EC/KBC 45 itself.

If a transition to the non-operative state (e.g. standby state) is instructed by the user, the CPU 30 outputs a standby state transition instruction to the EC/KBC 45. Upon receiving the standby state transition instruction (Yes in block A1), the EC/KBC 45 determines whether the plug 27 is inserted in the line-in terminal 19, based on a status signal S1 from the switch 52 that is incorporated in the line-in terminal 19.

If the plug 27 is not inserted in the line-in terminal 19, the switch 52 is turned off, and the status signal S1 is set in a high state. If the status signal S1 is in the high state, the EC/KBC 45 determines that the plug is not inserted in the line-in terminal 19 (No in block A2).

In this case, the sound controller 50 is transitioned to a non-operative state by an instruction from the CPU 30 (block A7). In addition, the EC/KBC 45 executes an ordinary process of a transition to a standby state, and then instructs power control to transition the entire personal computer 10 to the standby state (block A8). Specifically, since the plug 27 is not inserted in the line-in terminal 19, the EC/KBC 45 instructs such power control as to supply only the B-power and S-power, as shown in FIG. 4, thereby to disable the audio output function and to effect a transition to the standby state.

On the other hand, if the plug 27 is inserted in the line-in terminal 19 (Yes in block A2), the switch 52 that is incorporated in the line-in terminal 19 is turned on, and the status signal S1, which is supplied to the EC/KBC 45, is set in a low state. If the EC/KBC 45 determines, based on the status signal S1, that the plug 27 is inserted in the line-in terminal 19, the EC/KBC 45 notifies the CPU 30. The CPU 30 executes a process for enabling the audio output function and effecting a transition to the standby state.

To start with, the CPU 30 reads, via the EC/KBC 45, an output level set value of audio at the time of the operation of the sound controller 50 (block A3). Alternatively, the CPU 30 calculates an output level set value of audio by the audio player 25, based on setup data of a sound control program which controls the sound controller 50. Specifically, the CPU 30 determines an increment of the volume, which is adjusted by the sound controller 50 at the time of the operation.

In the meantime, in the personal computer 10, data is preset which is indicative of the relationship in correspondency between output level set values of the sound controller 50 and output level set values of the speaker amplifier 54, which are used in order to cause the speaker amplifier 54 to substitutively perform the volume adjustment by the sound controller 50. FIG. 7 shows an example of the data indicative of the relationship in correspondency between output level set values of the sound controller 50 and output level set values of the speaker amplifier 54.

For example, when the output level set value of the sound controller in FIG. 7 is "CL1", the output level set value of the speaker amplifier is set at "AL1" with respect to the analog audio signal bypassing the sound controller 50. Thereby, the volume of the sound output from the speakers 18 becomes constant.

After the output level set value of the sound controller 50 is acquired, the CPU 30 causes the sound controller 50 to analyze the signal level of the line-input analog audio signal, and waits until the signal level lowers to a preset level or less. When the level of the analog audio signal, which is input from the line-in terminal 19, has lowered to the preset level or less (Yes in block A4), the CPU 30 causes the EC/KBC 45 to change the analog switch 53 over to the path (second path) on the line-in terminal 19 side (block A5). Specifically, by switching the path at a timing when the level (volume) of the sound output from the speakers 18 is low, the interruption of sound due to the switching of the path is made less recognizable.

If the signal level of the line-input analog audio signal does not lower to the preset level or less even after a preset time-out period has passed, the CPU 30 causes the EC/KBC 45 to change the analog switch 53 over to the path (second path) on the line-in terminal 19 side, thereby to enable the audio output function before the process for transitioning the personal computer 10 to the non-operative state (standby state) is completed (block A5).

Since the sound controller 50 is controlled by the program, the sound controller 50 is transitioned to the non-operative state in the standby state. Thus, the EC/KBC 45 controls the analog switch 53 by the select signal S2, thereby to switch the path so that the analog audio signal, which is input from the line-in terminal 19, may bypass the sound controller 50 and go to the speaker amplifier 54.

After the path is changed over by the analog switch 53, the CPU 30 varies, via the EC/KBC 45, the output level set value of the speaker amplifier 54 in accordance with the output level set value of the sound controller 50, which has been acquired in block A3 (block A6). For example, when the output level set value of the sound controller 50, which has been acquired from the sound controller 50, is "CL1", the EC/KBC 45 executes control to set the output level set value of the speaker amplifier 54 at "AL1" by the level control signal S3.

Thereafter, the sound controller 50 is transitioned to the non-operative state by an instruction from the CPU 30 (block A7). In addition, the EC/KBC 45 executes a process of a transition to the standby state, and then instructs the power supply circuit 46 to execute power control to transition the entire personal computer 10 to the standby state, thereby to enable the audio output function (block A8). Specifically, in order to enable the audio output function and to effect a transition to the standby state, the EC/KBC 45 instructs such power control as to supply the A-power, as well as the B-power and S-power, as shown in FIG. 5.

As shown in FIG. 5, in the case where the plug 27 is inserted, while the power supply to many modules including the CPU 30 is turned off in the standby mode with reduced power consumption, the A-power is supplied to the speaker amplifier 54 and analog switch 53 which are associated with the audio output function.

FIG. 8A, FIG. 8B, FIG. 8C and FIG. 8D are views for explaining a process on an audio signal.

It is assumed that the plug 27 is inserted in the line-in terminal 19, and thereby an analog audio signal from the audio player 25 is input to the personal computer 10, as shown in FIG. 8A. It is also assumed that during the operation of the personal computer 10, while the sound corresponding to the analog audio signal that is input from the line-in terminal 19 is being output from the speakers 18, a process on the analog audio signal is executed by the sound controller 50, as shown in FIG. 8B, and the output level (volume) is adjusted. The sound controller 50 executes adjustment of the output level (volume) corresponding to the output level set value "CL1".

In the meantime, it is assumed that during the operation of the personal computer 10, the volume adjustment is performed by the sound controller 50 and a signal process of a fixed value (default output level set value) is performed by the speaker amplifier 54.

Assume now that a transition to the non-operative state (e.g. standby state) has been instructed by the user at a timing shown in FIG. 8D. After the transition to the non-operative state is instructed, if the sound controller 50 detects that the analog audio signal has lowered to the preset level or less at a timing A in the Figure, the EC/KBC 45 causes the analog switch 53 to switch the path so that the analog audio signal that is input from the line-in terminal 19 may bypass the sound controller 50 and go to the speaker amplifier 54.

Owing to the bypassing of the sound controller 50, the level of the signal that is input to the speaker amplifier 54 becomes lower than when the sound controller 50 is in operation, as shown in FIG. 8A. The CPU 30 varies the output level set value of the speaker amplifier 54 to "AL1" in accordance with the output level set value "CL1" at the time of the operation of the sound controller 50. Thereby, the volume adjustment, which has been executed by the sound controller 50 in operation, is substitutively executed by the speaker amplifier 54 in place of the sound controller 50. Thus, as shown in FIG. 8C, the sound can be output at the same output level as the output level (FIG. 8B) of the sound controller 50 in operation.

Thereafter, as shown in FIG. 8D, the personal computer 10 is transitioned to the standby state. At the time of the transition to the standby state, the sound output function (sleep & music function) is enabled. Specifically, the power supply (supply of A-power) to the speaker amplifier 54 is turned on, and the analog switch 53 is changed over such that the sound controller 50 is bypassed. Thereby, even after the personal computer 10 is set in the non-operative state, the sound (music) by the audio signal that is output from the audio player 25 can continuously be output from the speakers 18 that are built in the personal computer 10.

As described above, if the transition to the non-operative state (e.g. standby state) is instructed while the audio player 25 is connected to the personal computer 10 and the audio from the audio player 25 is being output from the speakers 18, the analog switch 53 is changed over at the timing when the signal level of the audio signal has lowered to the set level or less. Thereby, the interruption of sound due to the change-over of the analog switch 53 can be made less recognizable.

Furthermore, the output level set value of the speaker amplifier 54 is varied in accordance with the output level set value which is adjusted by the sound controller 50 at the time of operation. Thereby, the output level (volume) of sound can be made constant before and after the switching of the operation state of the personal computer 10. It is thus possible to prevent the user from feeling unnaturalness while listening to sound that is output from the speakers 18.

Figure 9:
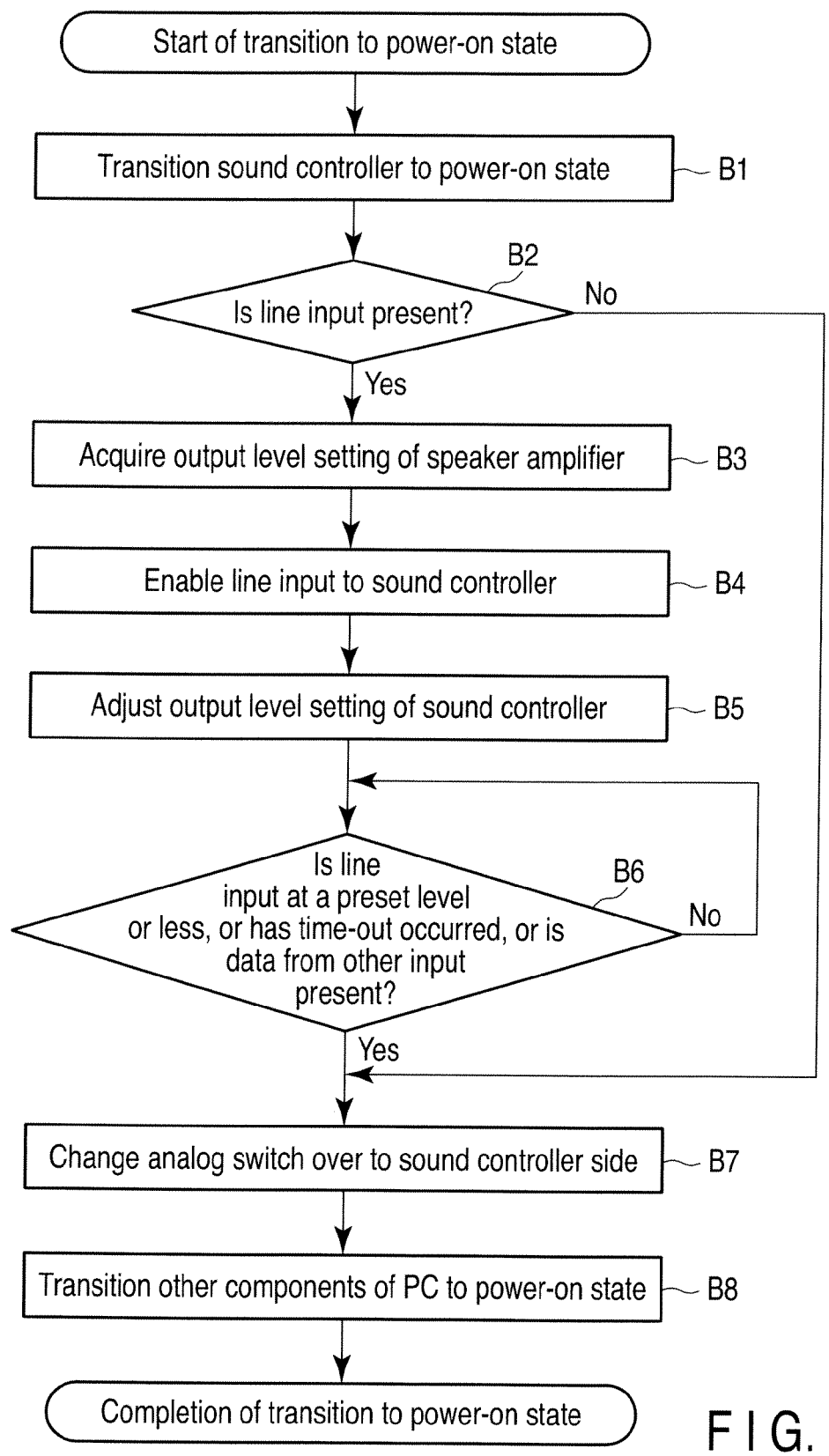
FIG. 9 is an exemplary flow chart illustrating an operation at a time when the personal computer in the embodiment transitions from the non-operative state to the operative state.

Next, referring to a flow chart of FIG. 9, a description is given of the case in which the personal computer 10 transitions from the non-operative state to the operative state (power-on state). Basically, the adjustment of the output level and the change-over of the analog switch 53 are executed by procedures which are reverse to the above-described procedures in the process of the transition from the operative state to the non-operative state.

If a transition to the operative state (power-on) is instructed by the user, the CPU 30 outputs an operative state transition instruction to the EC/KBC 45, and transitions the sound controller 50 to the operative state (block B1).

Upon receiving the operative state transition instruction, the EC/KBC 45 determines whether the plug 27 is inserted in the line-in terminal 19, based on the status signal S1 from the switch 52 that is incorporated in the line-in terminal 19.

If the plug 27 is not inserted in the line-in terminal 19, the EC/KBC 45 changes, by the select signal S2, the analog switch 53 over to the path (second path) on the sound controller 50 side (block B7). In addition, the EC/KBC 45 executes an ordinary process of a transition to a power-on state, and then instructs power control to transition the personal computer 10 to the normal power-on state (block B8).

On the other hand, if the plug 27 is inserted in the line-in terminal 19 (Yes in block B2), the CPU 30 acquires the output level set value of the speaker amplifier 54 via the EC/KBC 45 (block B3).

The CPU 30 enables the input of the analog audio signal from the line-in terminal 19 to the sound controller 50 (block B4), and adjusts the output level set value of the sound controller 50 in accordance with the output level set value of the speaker amplifier 54 which has been acquired in block B3 (block B4). Specifically, when the output level set value, which is set for the speaker amplifier 54 at the time of the non-operative state, is restored to the default output level set value at the time of operation, the volume of sound, which is output from the speakers 18, is made constant before and after the transition of the operation state by the volume adjustment of the sound controller 50.

For example, when the output level set value of the speaker amplifier 54 is "AL1", the output level set value of the sound controller 50 at the time of operation is adjusted and set at "CL1".

After adjusting the output level set value of the sound controller 50, the CPU 30 determines whether the signal level of the analog audio signal which is input from the line-in terminal 19 has lowered to the preset level, or the preset time-out period has passed, or a timing has come to output audio other than the audio from the line-in terminal 19. If the CPU 30 determines one of these states (Yes in block B6), the CPU 30 causes the EC/KBC 45 to change the analog switch 53 over to the path (second path) on the sound controller 50 side (block B7).

Examples of the audio, other than the audio from the line-in terminal 19, include a sound which is output in order to notify the user of the startup of the personal computer 10. The CPU 30 determines the output timing of the sound which is output in accordance with the startup process, and causes the EC/KBC 45 to change over the analog switch 53 in accordance with the determined output timing. Thereby, the audio other than the audio from the audio player 25 is output from the speakers 18, immediately after or substantially at the same time as the change-over of the analog switch 53, and the interruption of sound due to the change-over of the analog switch 53 becomes less recognizable.

After the analog switch 53 is changed over to the sound controller 50 side, the EC/KBC 45 instructs the power supply circuit 46 to execute power control to transition the entire personal computer 10 to the power-on state (block B8). Specifically, the EC/KBC 45 instructs such power control as to turn off the B-power, S-power, A-power and P-power.

As has been described above, if the audio player 25 is connected to the personal computer 10 that is in the non-operative state and if the transition to the operative state (power-on) is instructed while the audio from the audio player 25 is being output from the speakers 18, the output of the sound from the speakers 18 can be continued. In addition, by changing over the analog switch 53 in accordance with the timing at which the signal level of the audio signal has lowered to the preset level or less or the timing at which audio other than the audio from the audio player 25 is output, the interruption of sound due to the change-over of the analog switch 53 can be made less recognizable. Furthermore, the output level set value of the sound controller 50 is varied in accordance with the output level set value which is adjusted by the speaker amplifier 54 at the time of operation. Thereby, the output level (volume) of sound can be made constant before and after the switching of the operation state of the personal computer 10. It is thus possible to prevent the user from feeling unnaturalness while listening to sound that is output from the speakers 18.

In the above description, the analog switch 53 is changed over by determining whether the timing has come to output audio other than the audio from the line-in terminal 19. Alternatively, when it is determined that the timing has come to output audio other than the audio from the line-in terminal 19, the output of this audio can be stopped. In other words, the audio from the audio player 25 is preferentially output, and other audio, which interferes with the audio from the audio player 25, is prevented from being output.

The personal computer 10 may be provided with a volume dial for adjusting the volume by a user's manual operation when sound is being output from the speakers 18 by the audio output function in the non-operative state. For example, a volume dial is provided on a side surface of the computer main body 11. The speaker amplifier 54 is configured to be able to execute volume adjustment (output level setting) on the audio signal in accordance with the operation of the volume dial when the audio output function is enabled.

Even if the output level of the speaker amplifier 54 is varied by the user operation, as described above, the output level setting of the sound controller 50 can be adjusted in accordance with the output level setting of the speaker amplifier 54 according to the procedure illustrated in the flow chart of FIG. 9, when the personal computer 10 is transitioned to the power-on state. Thereby, the volume after the transition to the power-on state can be adjusted so as to become equal to the volume which has been adjusted by the volume dial.

In the process at the time of the transition to the non-operative state in FIG. 6, the output level (volume) of sound from the speakers 18 is controlled to be become constant before and after the switching of the operation state, by varying the output level set value of the speaker amplifier 54. In the case of such a structure that the output level of the speaker amplifier 54 cannot be adjusted, the transition to the non-operative state may be carried out according to the procedure illustrated in a flow chart of FIG. 10. A description of the process common to the flow chart of FIG. 6 is omitted here.

Figure 10:
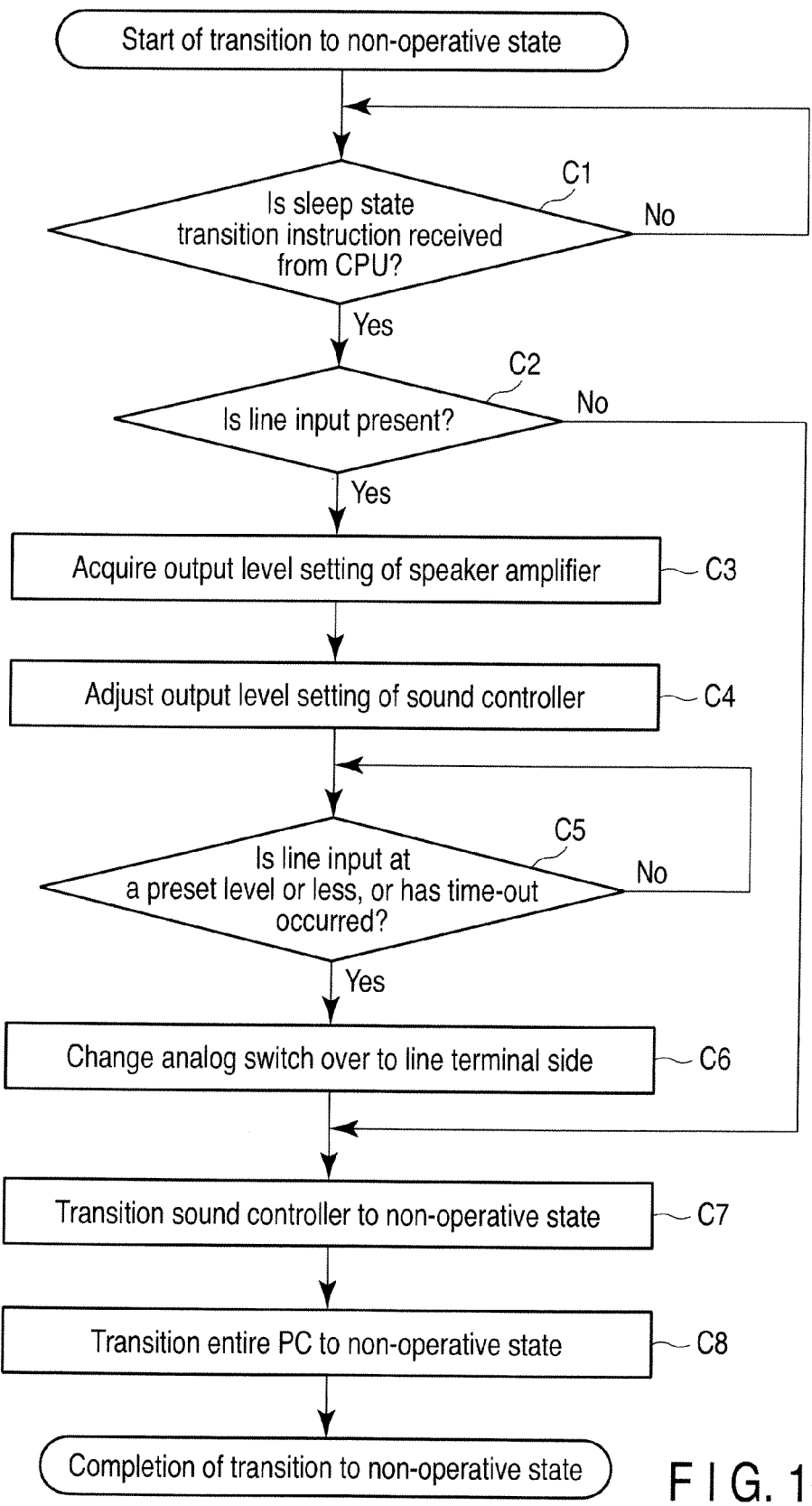
FIG. 10 is an exemplary flow chart illustrating an operation at a time when the personal computer in the embodiment transitions from the operative state to the non-operative state.

In the process illustrated in FIG. 10, at the time of the transition to the non-operative state, the CPU 30 acquires the output level set value (default value) of the speaker amplifier 54 before the switching of the path by the analog switch 53 is executed (block C3). The CPU 30 adjusts the output level set value of the sound controller 50 so that the volume of sound from the speakers 18 becomes constant after the transition to the non-operative state (block C4). Specifically, the output level adjustment value of the sound controller 50 is varied at the time of the operative state, so as to become equal to the output level of the sound which is output from the speaker amplifier 54 not through the sound controller 50, after the transition to the non-operative state.

For example, the output level set value of the sound controller 50 is gradually varied over a period of several seconds before the completion of the process of transition to the non-operative state.

Subsequently, when the level of the analog audio signal from the line-in terminal 19 has lowered to the preset level or less or after the time-out period has passed (Yes in block C5), the path is switched to the line-in terminal 19 side by the analog switch 53 (block C6) and the sound controller 50 is set in the non-operative state. Then, the entire personal computer 10 is set in the non-operative state (block C8).

As described above, in the case of the structure in which the output level of the speaker amplifier 54 cannot be adjusted, the output level set value of the sound controller 50 is adjusted in advance in accordance with the output level setting after the transition to the non-operative state. Thereby, it is possible to prevent the volume of sound, which is output from the speakers 18, from suddenly varying when the personal computer 10 is transitioned to the operative state.

In the above description, in the case where the plug 27 is attached when the personal computer 10 is in the power-on state, the audio output function (sleep & music function) is enabled after the transition to the non-operative state. Alternatively, whether the audio output function is to be enabled or disabled may be set in the non-operative state by the user's instruction.

For example, the BIOS setup of the personal computer 10 or a hardware setup program (utility, application) is executed and, in this process, the enable/disable of the audio output function may be set according to an instruction from the user. This setup content is recorded in the nonvolatile memory (e.g. BIOS-ROM 42) of the personal computer 10.

In the case of transitioning the personal computer 10 to the non-operative state, the setup content recorded in the nonvolatile memory is set in the recording medium (e.g. register) of the EC/KBC 45. If the setup content indicating that the audio output function is enabled at the time of the non-operative state is recorded in the recording medium, the EC/KBC 45 renders the audio output function usable when the insertion of the plug 27 in the line-in terminal 19 is detected by the status signal S1. Specifically, the EC/KBC 45 causes the power supply circuit 46 to turn on the power supply of the A-power, sets the speaker amplifier 54 and analog switch 53 in the operative state, and changes the analog switch 53 over to the path on the line-in terminal 19. Thereby, with the insertion of the plug 27 in the line-in terminal 19 when the personal computer 10 is in the non-operative state, the audio from the audio player 25 can be output from the speakers 18.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a speaker;
a terminal configured to receive an audio signal from an external apparatus;
an amplifier configured to amplify the audio signal received from the terminal, and to output sound from the speaker;
a power supply circuit configured to supply power to the amplifier;
a switch module configured to switch between (1) a first path which connects the terminal and the amplifier and bypasses a sound controller, the sound controller configured to operate when the electronic apparatus is in an operative state, and (2) a second path which connects the terminal and the amplifier via the sound controller;
an audio control module configured to adjust a signal level of the audio signal when the electronic apparatus is in the operative state; and
a controller configured to cause the switch module to change over to the first path when the electronic apparatus transitions from the operative state to a non-operative state and cause the switch module to change over to the second path when the electronic apparatus transitions from the non-operative state to the operative state, and to continue the supply of power to the amplifier by the power supply circuit and adjust an output of the amplifier based on the signal level adjusted by the audio control module, if the external apparatus is connected to the terminal when the operative state of the electronic apparatus is transitioned.

2. The electronic apparatus of claim 1, wherein the controller is configured to cause the switch module to switch from the first path to the second path when the level of the audio signal received from the terminal has lowered to a preset value or less.

3. The electronic apparatus of claim 1, further comprising:
a determination module configured to determine an output timing of audio which is output and is other than the audio signal received from the terminal,
wherein the controller is configured to cause the switch module to conduct a switching operation in accordance with the output timing determined by the determination module.

4. The electronic apparatus of claim 1,
wherein the controller is configured to change the signal level adjusted by the control module based on an output level of the amplifier when the electronic apparatus transitions from the non-operative state to the operative state.

5. The electronic apparatus of claim 4, wherein the controller is configured to cause the switch module to switch from the first path to the second path when the level of the audio signal received from the terminal has lowered to a preset value or less.

6. The electronic apparatus of claim 1,
wherein the controller is configured to cause the switch module to select the first path after causing the audio control module to adjust the signal level in accordance with the output of the amplifier in the non-operative state, when the electronic apparatus transitions from the operative state to the non-operative state.

7. The electronic apparatus of claim 6, wherein the controller is configured to causing the switch module to switch from the first path to the second path when the level of the audio signal received from the terminal has lowered to a preset value or less.

8. The electronic apparatus of claim 6, further comprising:
a determination module configured to determine an output timing of audio which is output and is other than the audio signal received from the terminal,
wherein the controller is configured to cause the switch module to switch in accordance with the output timing determined by the determination module.

9. An audio signal-processing method for use in an electronic apparatus, comprising:
receiving an audio signal from an external apparatus via a terminal to which the external apparatus is connected;
changing over to a first path which connects the terminal and an amplifier and bypasses a sound controller, the sound controller configured to operate when the electronic apparatus is in an operative state, when the electronic apparatus transitions from the operative state to a non-operative state;
changing over to a second path which connects the terminal and the amplifier via the sound controller when the electronic apparatus transitions from the non-operative state to the operative state;
adjusting a signal level of the audio signal at a time of operation of the electronic apparatus;
continuing supply of power to the amplifier by the power supply circuit if the external apparatus is connected to the terminal when an operation state of the electronic apparatus is transitioned; and
causing the amplifier to amplify the audio signal received from the terminal based on the signal level adjusted by the sound controller, and outputting the amplified audio signal to a speaker.

* * * * *